United States Patent
Nishioka et al.

[11] Patent Number: 6,043,665
[45] Date of Patent: Mar. 28, 2000

[54] CAPACITOR CHARGING CURRENT MEASUREMENT METHOD

[75] Inventors: Yoshinao Nishioka, Shiga-ken; Mitsuru Kitagawa, Yokaichi; Masao Nishimura, Shiga-ken; Toshinari Tabata, Ohtsu, all of Japan

[73] Assignee: Murata Manufacturing Co., Ltd., Japan

[21] Appl. No.: 08/984,809

[22] Filed: Dec. 4, 1997

[30] Foreign Application Priority Data

Dec. 5, 1996 [JP] Japan .................................. 8-342708
Jul. 14, 1997 [JP] Japan .................................. 9-205227

[51] Int. Cl.[7] .......................... G01R 27/28; G01R 31/12
[52] U.S. Cl. .......................................... 324/678; 324/548
[58] Field of Search .................................. 324/527, 536, 324/548, 551, 678, 71.1, 658; 209/574; 320/166; 702/57

[56] References Cited

U.S. PATENT DOCUMENTS

| | | | |
|---|---|---|---|
| 4,841,228 | 6/1989 | Noguchi et al. | 324/548 |
| 4,931,721 | 6/1990 | Berrigan et al. | 324/548 |
| 5,294,889 | 3/1994 | Heep et al. | 324/678 |
| 5,510,719 | 4/1996 | Yamamoto | 324/548 |
| 5,677,634 | 10/1997 | Cooke et al. | 324/548 |

FOREIGN PATENT DOCUMENTS

| | | |
|---|---|---|
| 123367 | 6/1987 | Japan . |
| 113545 | 5/1997 | Japan . |

*Primary Examiner*—Diep N. Do
*Attorney, Agent, or Firm*—Ostrolenk, Faber, Gerb & Soffen, LLP

[57] ABSTRACT

A method for accurately measuring the insulation resistance of a capacitor while reducing time taken for the measurement. To this end, a current calculation equation is first obtained based on an equivalent circuit of a capacitor; then, the calculation equation is modified or corrected based on the degree of coincidence between an actually measured current value m(t) and a calculated current value i(t), the former being within a charge-up region of a dielectric polarization component upon initial application of a voltage; next, the current value at a time point of chargeup termination is predicted or estimated by use of this modified calculation equation.

49 Claims, 10 Drawing Sheets

CAPACITOR CHARGING CURRENT MEASUREMENT METHOD

BACKGROUND OF THE INVENTION

1. Field of the Invention

The present invention relates in general to capacitor charging current measurement methods and, more particularly, to a charging current measurement method adaptable for use in measuring the insulation resistance of capacitors.

2. Description of the Prior Art

Generally, for purposes of reliability testing, there is known a method for measuring the insulation resistance of a capacitor by applying a direct current (DC) measurement voltage to the capacitor and by measuring a leakage current (charging current) of such capacitor after full charge-up thereof. Obviously, normal or acceptable products are lower in leakage current.

A well known charging current measurement method is defined by JIS-C5102. This scheme requires that current value measurement be done under the condition that a capacitor under measurement is fully charged up, which in turn requires a measurement time of approximately 60 seconds to elapse. However, as it is becoming more strictly demanded to reduce manufacturing costs while increasing reliability of electronic equipment, a further increase in productivity and quality is also demanded for electronic components such as capacitors for use with such equipment; in view of this, the prior known measurement method which needs a substantial length of measurement time duration per capacitor is no longer capable of fully responding to such demands.

Another method has been proposed in which a charging current value is measured at a plurality of times within a shortened time period immediately after initiation of application of a voltage to a capacitor, thereby predicting, based on the resultant multiple current measurement values a current value which will occur after of a predefined time elapses (Japanese Patent Publication No. 5-78790). This method is designed to measure current values $I_0$, $I_1$, $I_2$ flowing through a capacitor at three different time points with constant time intervals therebetween, and to calculate, based on these three current measurement values, the current value $I_x$ after a predefined length of time elapses, by use of an equation as follows:

$$I_x = (I_1^2 - I_0 I_2)/(2I_1 - I_2 - I_0).$$

Figures 1, 2:
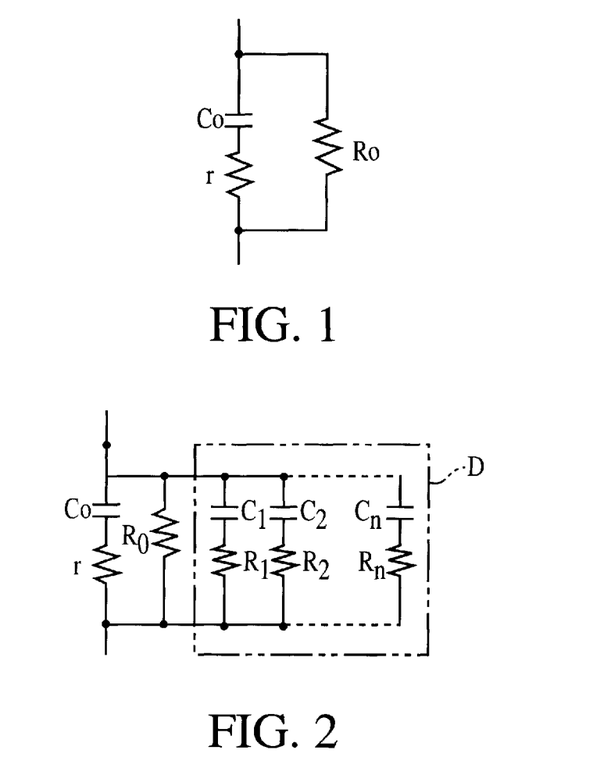
FIG. 1 is a circuit diagram of one example of an equivalent circuit of a capacitor.
FIG. 2 is a circuit diagram of another example of an equivalent circuit of a capacitor.

Use of this method enables computation or calculation of a result prior to the time that the first-mentioned method would take to reach a sufficient charge-up state, which might advantageously make it possible to measure an intended insulation resistance within a shortened time period. However, the above equation is based on the assumption that the equivalent circuit of a capacitor is as shown in FIG. 1. Therefore, an accurate insulation resistance will no longer be definable in the case of capacitors having a dielectric polarization component, such as ceramic capacitors.

More specifically, as shown in FIG. 1, a simplified capacitor equivalent circuit is comprised of a capacitance $C_0$, internal resistance r and insulation resistance $R_0$. However, an equivalent circuit of a real capacitor also includes a dielectric polarization component D, as shown in FIG. 2. It may be considered that during the initial chargeup period (10 milliseconds after the initiation of the charging operation, for example), the effects of the capacitance $C_0$, internal resistance r and insulation resistance $R_0$ appear most strongly; thereafter, however, the dielectric polarization component D controls the chargeup characteristics. Accordingly, with the prior art prediction method ignoring the presence of such dielectric polarization component D, it remains impossible or difficult to accurately predict the charging current at termination of the chargeup period (one minute later, for example).

SUMMARY OF THE INVENTION

The present invention provides a capacitor charging current measurement method capable of accurately measuring a current value at a time at which a capacitor is fully charged up, while reducing the time taken for the measurement.

To attain the foregoing result, this invention provides a specific method for measuring a charging current of a capacitor comprising the steps of applying a DC voltage to the capacitor, and predicting a current value during charging by use of a current value measured during a charge-up period of a dielectric polarization component of the capacitor, while the voltage is applied thereto.

Several types of methods have been developed for predicting such current value during charging.

In accordance with one aspect of the invention, a method is provided which includes the steps of initially determining a current calculation equation using an equivalent circuit of the capacitor; modifying the current calculation equation by determining the capacitances $C_1, C_2 \ldots C_n$ and resistance values $R_1, R_2 \ldots R_n$ of the dielectric polarization component D of the equivalent circuit, in such a way that an actually measured capacitor current value m(t) is identical to a calculated current value i(t) as obtained using the current calculation equation; and determining a current value during charging by using such modified current calculation equation.

The current-value prediction may alternatively be attained by use of another methodology including the steps of obtaining an approximation equation from a plurality of actually measured current values within the chargeup region of the dielectric polarization component of a capacitor, and making use of this approximation equation to predict a final current value during charging.

These and other objects, features and advantages of the invention will be apparent from the following more particular description of embodiments of the invention, as illustrated in the accompanying drawings.

DETAILED DESCRIPTION OF EMBODIMENTS OF THE INVENTION

Before presenting some embodiments of the invention, an explanation will be given of the history leading to conception of the present invention.

Figure 3:
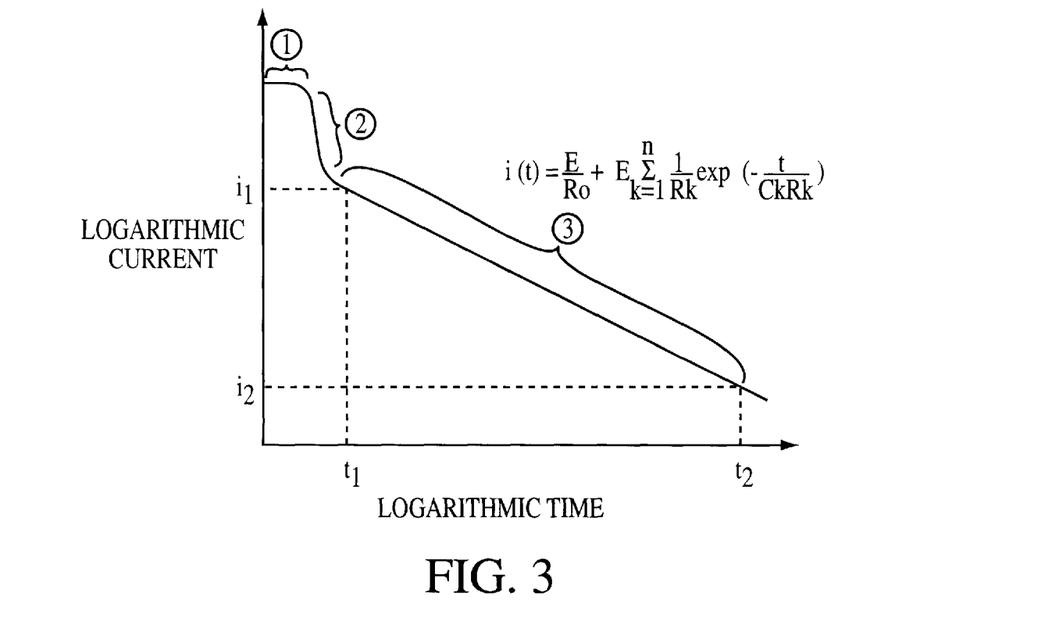
FIG. 3 is a diagram showing a capacitor charging current characteristic.

First, with regard to ceramic capacitors, changes in current value during charging have been accurately measured. Plotting such current and time coordinates on logarithmic current versus logarithmic time scales results in discovery of the presence of a specific characteristic as shown in FIG. 3 (indicated by a solid line). More specifically, a large current of substantially constant intensity flows in an initial short or minimal region [1] of the chargeup period. In a transition region [2] following this initial region, the current value rapidly drops down. And thereafter, the current decreases with a linear charging characteristic [3] having a certain gradient. This linear charging characteristic [3] is continuously observed until one to two minutes elapses, after the initiation of charging.

A study of the above characteristic reveals the fact that the initial-period charging characteristic [1] is a charging region corresponding to the simplified equivalent circuit of FIG. 1, whereas the linear charging characteristic [3] is a charging region of the dielectric polarization component. In light of this, a current value $i_2$ at a chargeup time $t_2$ may be accurately predictable by defining from a capacitor's equivalent circuit, for instance, a current calculation equation in the charging region [3] of the dielectric polarization component; actually measuring a current value $m(t_1)$ at the initial period (at time point $t_1$ of FIG. 3, for example) of the charging region [3] of the dielectric polarization component, modifying the current calculation equation in a way such that the measured current value $m(t_1)$ is identical to a calculated current value $i(t_1)$ as obtained using the equivalent circuit, and substituting time point $t_2$ at which the charging is sufficiently completed into the modified current calculation equation.

It should be noted that while the initial period (1) may somewhat vary depending upon the capacitor's capacitance value, the sum of the initial period (1) and transition period (2) is ordinarily less than or equal to 10 milliseconds. Accordingly, an accurate current calculation equation is obtainable by measuring the current values $i_1$, $i_2$ beginning at or near 10 milliseconds after initiation of charging.

With use of the method of this invention, it is possible to obtain the insulation resistance within a time period of several tens of milliseconds per capacitor thus noticeably improving the work efficiency as to insulation resistance measurements.

It eases the determination of the capacitances $C_1, C_2 \ldots C_n$ as well as the resistances $R_1, R_2 \ldots R_n$ of the dielectric polarization component D of the equivalent circuit, by representing them, using a certain relational equation, in the relation of a geometric progression. Respective initial terms $C_1$, $R_1$ and common ratios p, q can be predetermined in accordance with each product. This renders readily determinable the capacitances $C_2 \ldots C_n$ and resistances $R_2 \ldots R_n$ by the geometric progression.

In order to evaluate the degree of coincidence between the measured current value m(t) and calculated current value i(t), a simple way may be to perform linear approximation with log m(t)–log i(t) and time being plotted along coordinate axes.

Alternatively, second-order or quadratic curve approximation may be employed as the evaluation method. This quadratic approximation may also be used along with the linear approximation. More specifically, where the linear approximation causes the gradient and intercept to be nearly equal to zero, it is judged in the linear approximation method that these are identical to each other; however, they are not always identical in real cases. Therefore, by performing the quadratic curve approximation after such linear approximation, it becomes possible to attain extra-high accuracy approximation.

As the linear approximation evaluation function, log m(t)/log i(t), m(t)/i(t), or m(t)–i(t) can be used in addition to log m(t)–log i(t). In this case, if the gradient and intercept are made close to 0 and 1, respectively, the coincidence is completed. Further, in this case, quadratic curve approximation can also be employed as the evaluation method.

Figure 4:
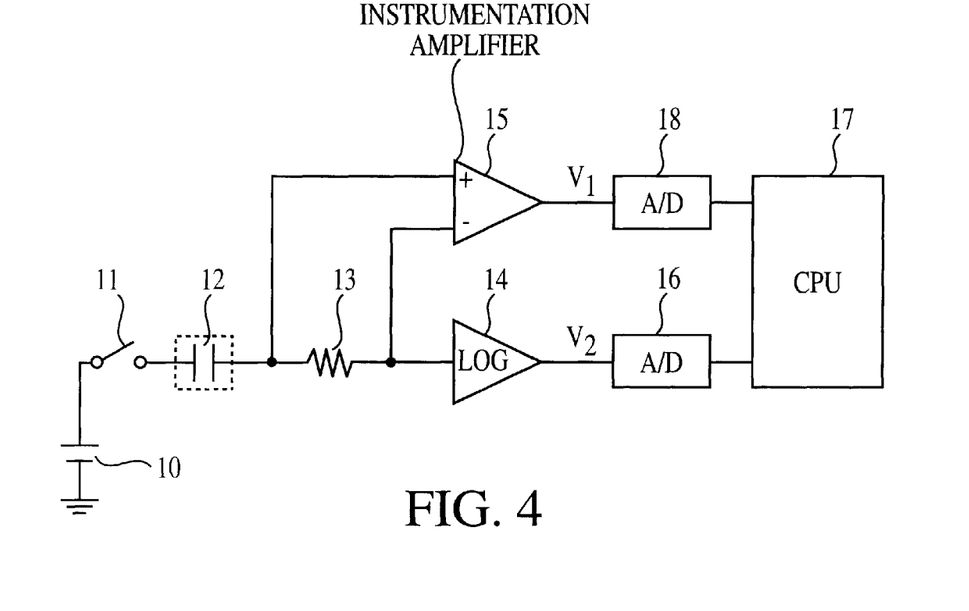
FIG. 4 is a circuit diagram of one example of a charging current measurement device.

FIG. 4 shows one exemplary current measurement device embodying the principles of the instant invention. This measurement device is the one which has been proposed in Japanese Patent Application No. 7-293442 under the name of the applicant of this application.

This current measurement device includes a direct current (DC) measurement power supply 10, switch 11, capacitor 12 as an object to be measured, current control resistor 13, logarithmic amplifier 14, instrumentation amplifier 15, A/D converters 16, 18, and arithmetic processing circuit (CPU) 17. The device is designed to activate amplifier 15 to measure an intended current value in an initial charge-up period, switch to the logarithmic amplifier 14 at a predefined threshold value, and thereafter, allow logarithmic amplifier 14 to measure the current value. This measurement device is capable of offering accurate measurements even when the charging current of capacitor 12 varies over a wide range, which may in turn lead to the possibility of accomplishing continuous or "seamless" current-value measurement throughout a whole period spanning from the initial period to the termination period of such chargeup operation, which has otherwise remained difficult to attain with prior art measurement devices.

An explanation will now be given of principles of the charging current measurement method of the invention.

First of all, the equivalent circuit of a capacitor is represented by that shown in FIG. 2 as stated supra. The capacitances $C_1, C_2 \ldots C_n$ and resistances $R_1, R_2 \ldots R_n$, which are the dielectric polarization component of the equivalent circuit of FIG. 2, have the relation of a geometric progression as given below:

$$C_k = p^{k-1} C_1, \ R_k = q^{k-1} R_1,$$

where k=1, 2 . . . n; $C_1$, $R_1$, p and q are constants.

An equation of current flowing in the equivalent circuit may be given by the following Equation (1):

$$i(t) = \frac{E}{R_0} + E \sum_{k=1}^{n} \frac{1}{R_k} \exp\left(-\frac{t}{C_k R_k}\right)$$

where E is the voltage applied to the capacitor, t is the time, and $R_0$ is the insulation resistance.

In Equation (1), the first term thereof represents a current flowing in the insulation resistance $R_0$ whereas its second term indicates a current flowing through the dielectric polarization component D. Note that while some current attempts at the beginning of chargeup to flow into a series circuit of the capacitance $C_0$ and the internal resistance r, such current is not considered in Equation (1) since it is of no direct relation to the current calculation equation of the invention.

Next, the parameters $C_1$, $R_1$, p and q are determined in a such way that the calculated current value i(t) being set as discussed previously is substantially identical to an actually measured current value m(t) as obtained by the current measurement device of FIG. 4.

Evaluation of the degree of coincidence between the calculated current value i(t) and measured current value m(t) is carried out in the following way. First, an evaluation function n(t) is defined as:

$$n(t) = \log m(t) - \log i(t).$$

Next, the resulting evaluation function n(t) obtained by the above equation is subjected to linear approximation. An equation of approximation used herein is given as a linear equation y=ax+b, wherein the coincidence degree is judged to be high as the gradient a and intercept b of this equation become closer to zero. Additionally, the evaluation time point t may be set at the beginning (after 5 to 20 milliseconds, for example) of the charging region [3] of the dielectric polarization component in FIG. 3.

This evaluation time depends on the objectives of the measurement, such as to evaluate the coincidence degree with high speed, or to evaluate the coincidence degree with high accuracy. The evaluation time may be adopted arbitrarily in accordance with those objectives.

In this way, by modifying the calculation equation (1) using parameters of high coincidence degree and substituting a chargeup termination time (60 seconds, for example) into such modified calculation equation (1), it is possible to obtain a current value at termination of the chargeup operation.

The disclosed measurement method will be explained further by use of some examples.

First, in a case where a multilayer ceramic capacitor is the capacitor to be measured, the parameters $C_1$, $R_1$, p and q are initially set at certain values as follows:

$C_1 = 210 \times 10^{-12}$, $R_1 = 0.1 \times 10^6$, p=1.07, q=2.1.

Figure 5:
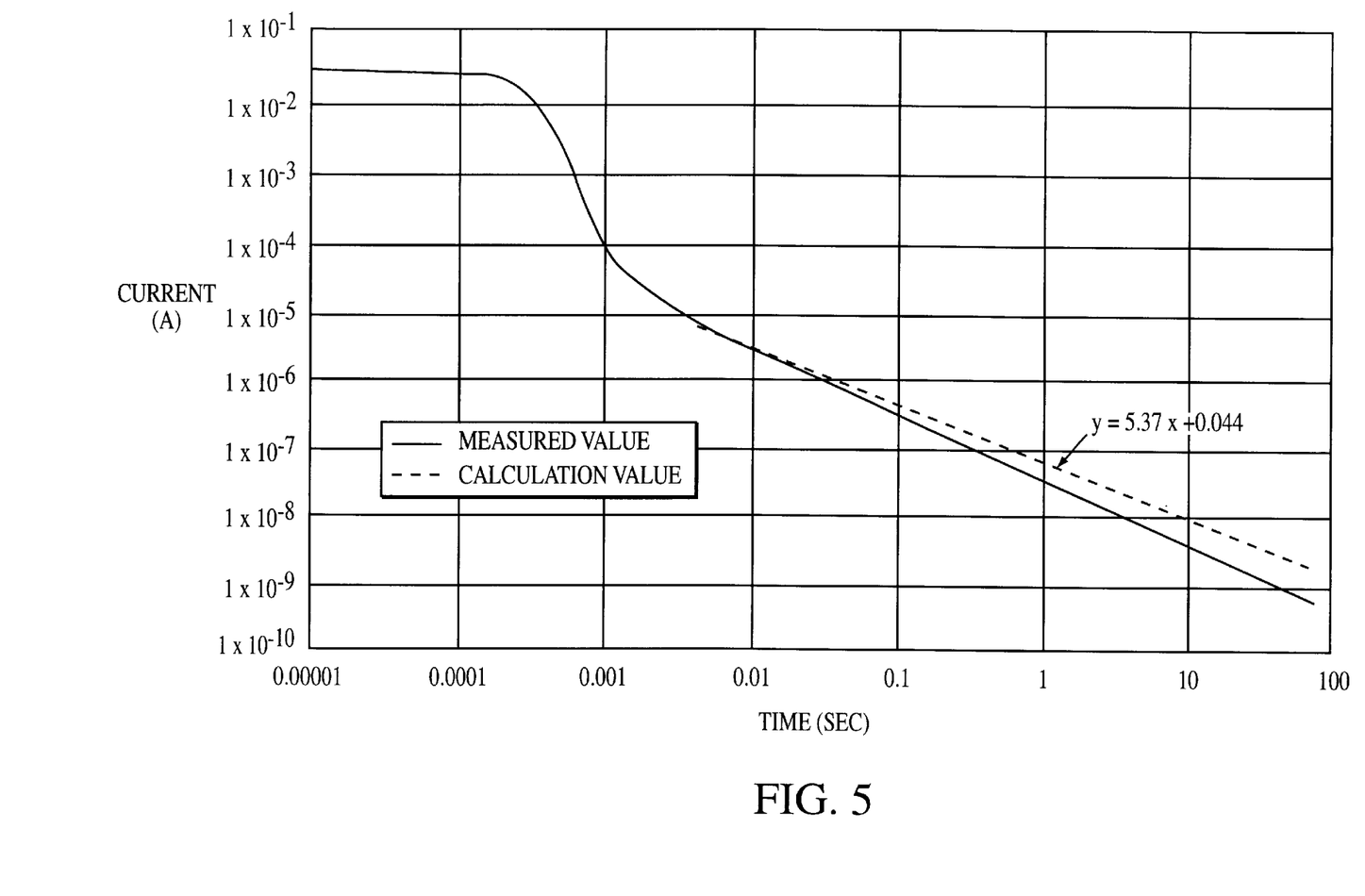
FIG. 5 is a diagram showing a comparison between a before-modification calculation value of a current calculation equation in accordance with the present invention, and its corresponding measurement value.

Current values i(t) calculated using these initially set values are demonstrated in FIG. 5 along with actually measured values m(t). A linear approximation equation obtained using such initial values is such that the gradient a=5.37 and intercept b=0.044 as in the equation of FIG. 5, both of which remain far from zero. Due to this, it will be readily seen that one calculated value i(t) after 60 seconds elapses, by way of example, is not identical to its corresponding measured value m(t).

Figure 6:
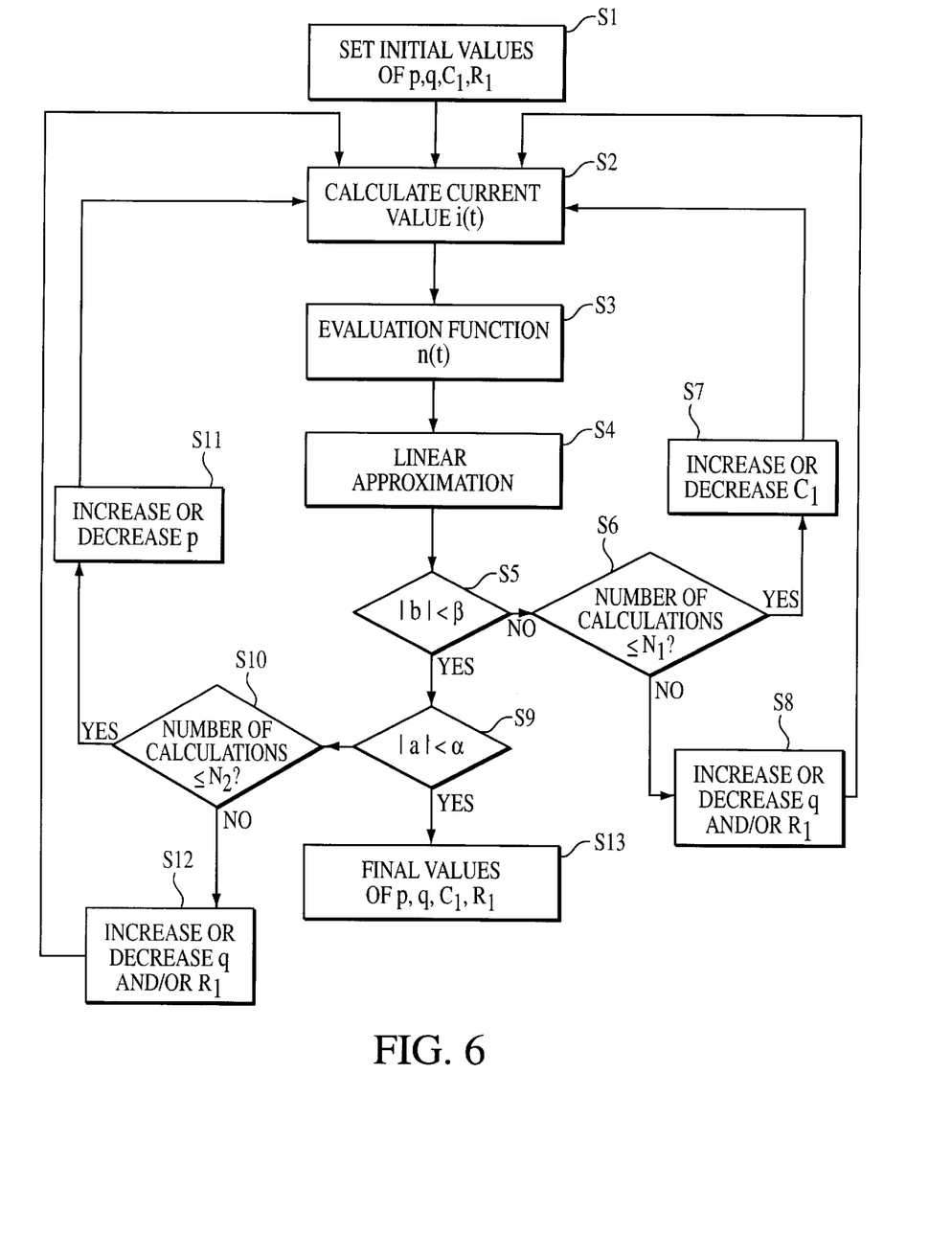
FIG. 6 is a flowchart showing a method of determining a parameter by use of a linear approximation method.

Next, the parameters $C_1$, $R_1$, p and q are so modified using a method shown in FIG. 6 as to force the gradient a and intercept b to be close to or approximately zero, for example less than 0.01, thereby increasing the degree of coincidence between calculation and measurement.

First, the values of parameters $C_1$, $R_1$, p and q (step S1) are initially set.

Then, the initially set parameters are employed to obtain by Equation (1) a calculated current value i(t) in the charging region [3] of the dielectric polarization component D (for instance, about 10 milliseconds or more after start-up of the charging operation) (step S2).

Subsequently, an actually measured value m(t) is measured at the same time point, and the evaluation function n(t) is obtained based on a difference in logarithmic value between the actually measured value m(t) and calculation value i(t) (step S3).

Next, linear approximation of the evaluation function n(t) is performed (step S4).

Next, it is judged whether or not the absolute value of the intercept b of the approximation equation y=ax+b is less than a predetermined value β (for example, β=0.01) (step S5). This step judges whether the intercept b is near zero.

At step S5, if $|b| \geq \beta$ then it is judged whether the number of approximation calculations which have been executed falls within a predefined number $N_1$ (step S6). This is to avoid occurrence of an infinite loop.

If the approximation calculation number is less than or equal to $N_1$ then $C_1$ is increased or decreased by a fixed value depending upon whether b is positive or negative in polarity (step S7).

Once the number of approximation executions is greater than or equal to $N_1$, this means that modifying $C_1$ has failed to cause the intercept b to approach zero; accordingly, q and/or $R_1$ is increased or decreased by a fixed value depending on whether b is positive or negative (step S8).

After modifying $C_1$, q, or $R_1$ at step S7 or step S8, the processing tasks of steps S2, S3, S4 and S5 are repeated.

If $|b| < \beta$ at step S5 then it is judged whether the absolute value of gradient a of the approximation equation is less than a specified value α (for example, α=0.01) (step S9).

At step S9, If $|a| \geq \alpha$ then it is judged whether the number of approximation calculations is within a predetermined number $N_2$ (step S10). This is also a process for elimination of an infinite loop.

If the number of approximation calculations is less than or equal to $N_2$ then p is increased or decreased by a constant value in conformity with whether the value of a is positive or negative (step S11).

Once the number of approximation calculations is greater than or equal to $N_2$, this indicates that modification of p has failed to let gradient a come closer to zero; therefore, q and/or $R_1$ is increased or decreased by a fixed value depending upon whether a is positive or negative (step S12).

After completing modification of p or q and/or $R_1$ at step S11 or S12, steps S2, S3, S4, S5 and S9 are repeated; in the case of $|b| < \beta$ and $|a| < \alpha$, it is judged that coincidence is completed (step S13). In other words, the parameters $C_1$, $R_1$, p and q are finally determined.

The finally defined parameters are as follows:

$C_1 = 198.3 \times 10^{-12}$, $R_1 = 0.1 \times 10^6$, p=1.093, q=2.1.

Figure 7:
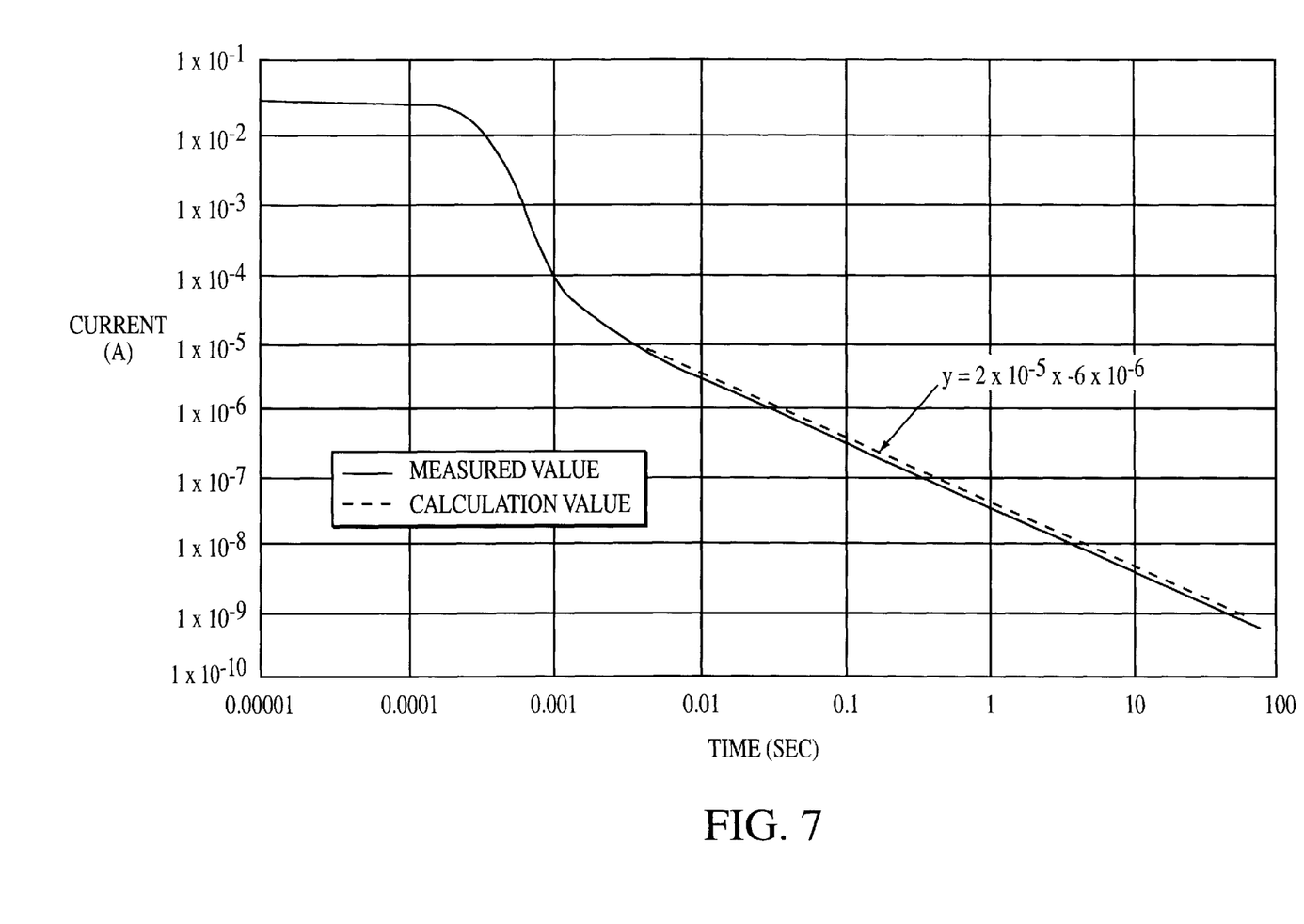
FIG. 7 is a diagram showing a comparison between an after-modification calculation value of the current calculation equation in accordance with this invention, and its corresponding measurement value.

FIG. 7 is a comparative diagram of the calculation values (t) obtained using such modified parameters and the actually measured values m(t). The linear approximation equation in this case is such that both gradient $a=2\times10^{-5}$ and intercept $b=6\times10^{-6}$, are near zero.

As apparent from FIG. 7, the calculation values i(t) and measurement values m(t) are in good coincidence with each other even at the termination of the charging operation (60 seconds after, for example), which demonstrates clearly that the method of this invention is an extra-high accuracy prediction method.

While the above embodiment is arranged so that the parameters $C_1$, $R_1$, p, q are modified by linear approximation, such parameter modification may alternatively be done by use of quadratic curve approximation in addition to linear approximation.

Figure 8:
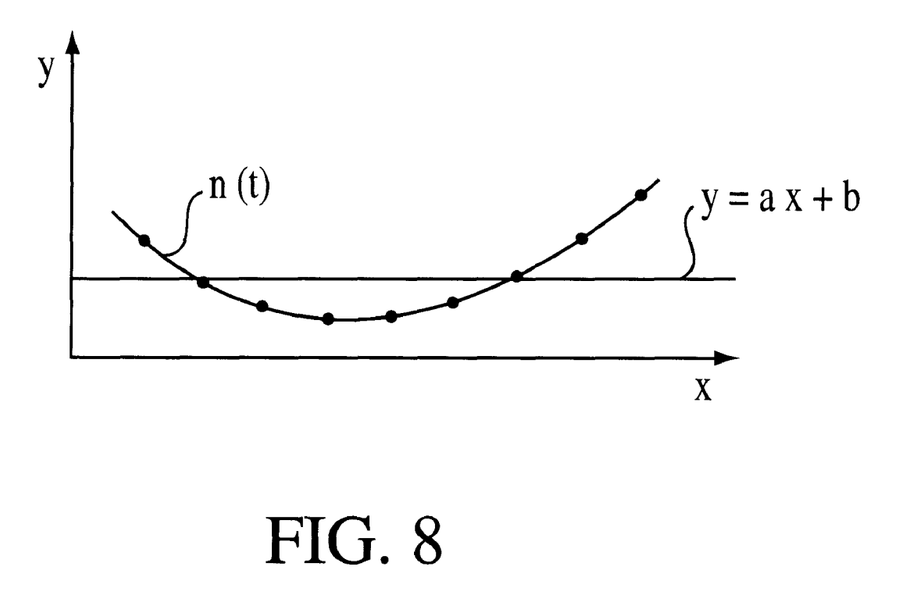
FIG. 8 is a diagram demonstrating a case where no linear approximation is possible.

More specifically, as shown in FIG. 8, in the case of approximation using a line y=ax+b with respect to a difference n(t) in logarithmic value between each measured value and calculation value, the resulting gradient a and intercept b are both near zero in value, which means that the linear-approximation coincidence degree is high. However, the measured value and approximation line are not identical to each other. This would result in the presence of an increased difference between a calculation value and its corresponding measured value at the termination of the chargeup operation. If this is the case, the use in addition of quadratic curve approximation may enable evaluation of the coincidence degree with enhanced accuracy.

In the case of a method which includes quadratic curve approximation, the approximation equation of the evaluation function n(t) is assumed to be given by $y=dx^2+ex+f$, and it is judged that the coincidence degree is high when its second-order or quadratic coefficient d is near or around zero and at the same time the value (-e/2d) is at a specific value during a certain time period for measuring the coincidence degree. Preferably, the interval time period may be set in a range of from 5 to 20 milliseconds. Where the coincidence degree is low, the value of $R_0$ is changed or updated in the calculation equation (1). In this way, by obtaining the current value using the calculation equation (1) which employs modified parameters after modifying the parameters so as to cause the coincidence degree between the linear approximation equation and quadratic curve approximation equation to increase, it is possible to obtain an even more accurate calculation value.

Figure 9:
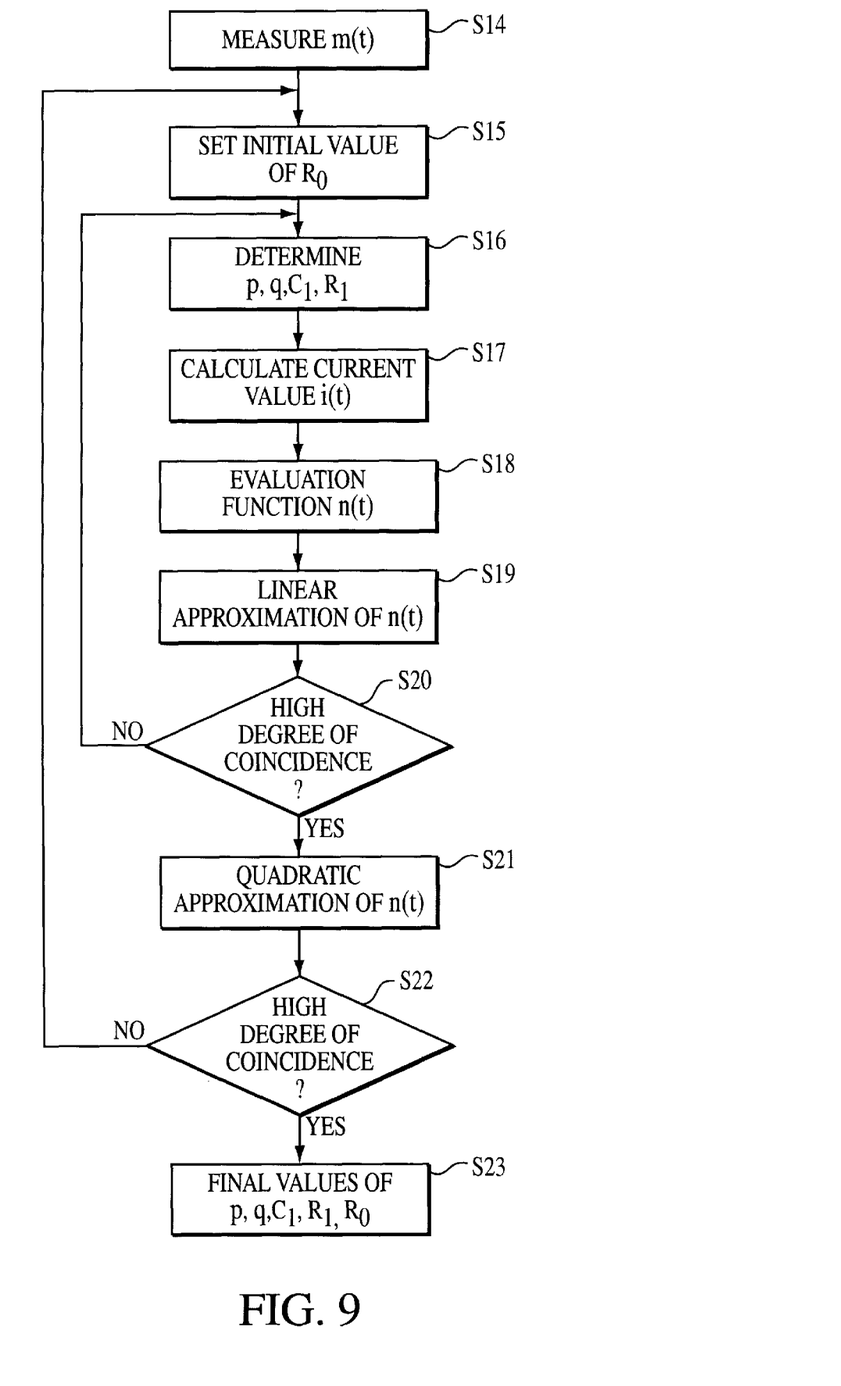
FIG. 9 is a flowchart diagram showing a parameter determination method employing both the linear approximation method and the quadratic curve approximation method.

FIG. 9 is a diagram showing a parameter determination method which employs both the linear approximation method and quadratic curve approximation method.

Firstly, a current value m(t) is measured at the beginning of the chargeup operation (5 to 20 milliseconds, for example) (step S14).

Then, the insulation resistance $R_0$ is determined. A sufficiently significant value is set as the initial value of $R_0$ (step S15), about $10^{12}=1$ T.

Next, the parameters $C_1$, $R_1$, p and q (step S16) are determined. The initial values of these parameters may be empirically known values in a manner similar to those determined at step S1 of FIG. 6.

Next, the parameters determined in step S16 are used to obtain by the calculation equation (1) a calculated current value i(t) (step S17).

Next, an evaluation function n(t) is obtained based on a difference between an actually measured value m(t) and its corresponding current calculation value i(t) as obtained by computation (step S18).

Next, linear approximation of the evaluation function n(t) is carried out (step S19).

Next, it is judged whether the coincidence degree due to such linear approximation is high or not (step S20). A judgment method as used herein is based on whether the gradient a and intercept b in FIG. 6 are both in the vicinity of zero, for example less than 0.01. Where the coincidence degree remains lower, the parameters $C_1$, $R_1$, p, q are modified or corrected and then the tasks following step S16 are repeated.

When the coincidence degree is high, then the evaluation function n(t) is subjected to quadratic curve approximation (step S21).

Subsequently, it is judged whether the coincidence degree due to quadratic curve approximation is high or not (step S22). This judgement method is based on whether its quadratic coefficient d of the quadratic curve approximation equation is near zero and whether the value (-e/2d) is at a specific value falling within a specified interval time period for comparison of the coincidence degree. If the resulting coincidence degree is low then the parameter $R_0$ is modified and the tasks following step S15 are repeated.

If the coincidence degree due to quadratic curve approximation is judged to be high then the parameters $R_0$, $C_1$, $R_1$, p and q (step S23) are finally determined.

In the above-described embodiment, though the evaluation function n(t) is defined to be based on the difference between the measured value m(t) and the calculated value i(t), the invention is not limited thereto. That is, it is possible to carry out linear approximation based on a ratio in logarithmic value of the measured value m(t) to the calculated value i(t), a ratio of the measured value m(t) to the calculated value i(t), or a difference between the measured value m(t) and the calculated value i(t) as shown below:

$$n(t)=\log m(t)/\log i(t),$$

or $$n(t)=m(t)/i(t),$$

or $$n(t)=m(t)-i(t)$$

If the evaluation function n(t) is defined by n(t)=log m(t)/log i(t) or n(t)=m(t)/i(t), the coincidence degree can be evaluated depending on whether the gradient a of the linear approximation equation, y=ax+b, is close to 0, and the intercept b is close to 1. On the other hand, if the evaluation function n(t) is defined by n(t)=m(t)-i(t), the coincidence degree can be evaluated depending on whether the gradient a of the linear approximation equation, y=ax+b, is close to 0, and the intercept b is also close to 0.

In case the evaluation function n(t) is defined as described above, it is possible to employ the quadratic curve approximation in addition to or in place of the linear approximation.

Figure 10:
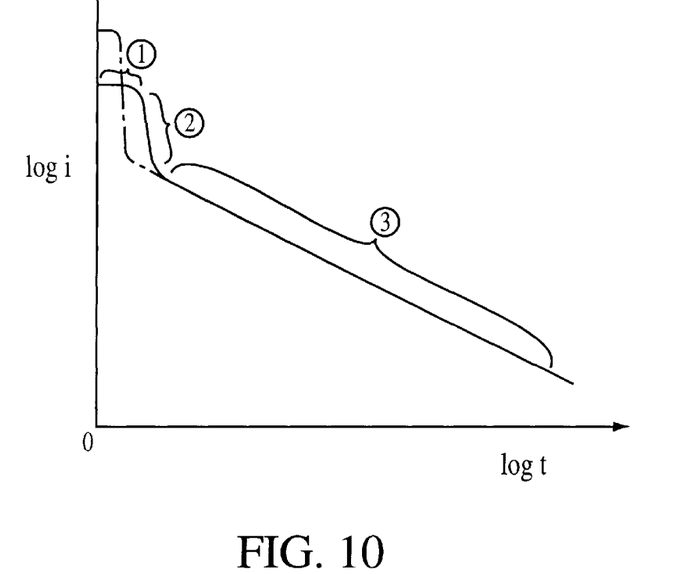
FIG. 10 is a capacitor charge-up characteristic diagram obtained with an increased charging current.

In the above embodiments, the charging current flowing in the capacitor is limited to 50 milliamperes (mA) as determined by the limit resistor 13 (see FIG. 4) in conformity with the JIS standard; however, it has been discovered that a chargeup response becomes faster with an increase in resistance value of limit resistor 13 as shown in FIG. 10. The solid line in FIG. 10 designates a case where the charging current is set at 50 mA whereas the two-dash-and-dot line indicates a case where the charging current is at 100 mA.

More specifically, as the current value increases in the chargeup region [3] due to a true or real capacitance, its time is shortened at the higher current. In contrast to this, the chargeup curve of the chargeup region [3] of the dielectric polarization component is almost perfectly unchanged by the higher current, whereby the start point of such chargeup region [3] is further accelerated. In other words, the chargeup region [3] of the linear dielectric polarization component D is extended in duration.

For the reason stated supra, while the first embodiment is arranged such that the execution of evaluation and modification of the calculation equation (1) begins at a specific time $t_1$ about 10 milliseconds after the start of the charging operation, it becomes possible to begin such evaluation and modification at a time prior to 10 milliseconds after starting. In other words, it is possible to measure an intended insulation resistance even faster, with accuracy further enhanced.

Figure 11:
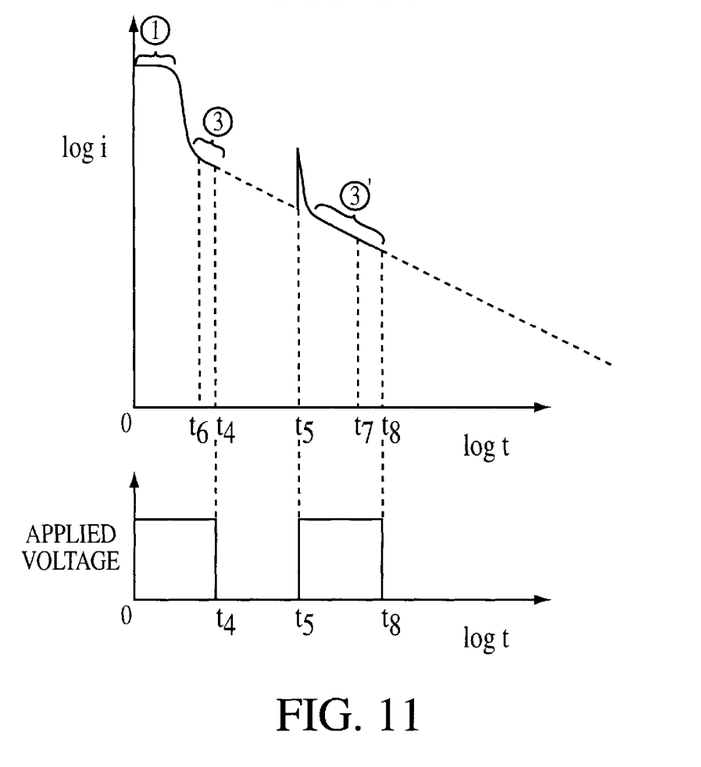
FIG. 11 is a capacitor charge-up characteristic diagram wherein the voltage is applied intermittently.

In the above embodiments also, the calculation equation was subjected to evaluation and modification based on its chargeup characteristics upon continuous application of a voltage to the capacitor. However, the inventor has discovered that an intended characteristic similar to that shown in FIG. 3 is obtainable even without use of such continuous voltage application scheme. FIG. 11 depicts a charging characteristic obtained when a DC voltage is intermittently applied thereto at certain time intervals.

It is apparent from viewing FIG. 11 that the chargeup region [1] due to the capacitance $C_0$ appears during a period spanning from the charging start point to a time point $t_4$ in a manner similar to that of FIG. 3, and that the voltage application is interrupted immediately after appearance of the dielectric polarization component chargeup region [3]. Next, when the voltage is again applied at a time point $t_5$, while a large inrush current initially flows, the current immediately returns to the linear chargeup characteristic [3]'. This chargeup characteristic [3], is an extension of the linear chargeup region [3] ranging from the chargeup initiation point to time $t_4$. Thereafter, similar intermittent voltage application will be repeated causing a charging current to decrease in accordance with the linear charging characteristic.

It should be noted in FIG. 11 that although the voltage application is seen to have been done at equal intervals, since the transverse axis of FIG. 11 is in logarithmic time scale, the second voltage application is actually greater in time length than the first one. This is for purposes of simplicity of explanation only; it will be appreciated that the voltage application time intervals may be alternatively rendered constant, or alternatively the first one may be longer than the second.

With use of the foregoing continual or "iterative apply-and-interrupt" voltage application scheme, it becomes possible to measure, after measurement of a current value $i_6$ at a time $t_6$ within the dielectric polarization component chargeup region [3] upon the first-time voltage application; to measure a current value $i_7$ at a time $t_7$ within the dielectric polarization component chargeup region [3]' upon the second voltage application; and also to evaluate and modify the calculation equation (1) by use of two or more current values including values $i_6$, $i_7$.

With this method, the facility of performance of insulation resistance measurement devices can be improved by avoiding the need to employ continuous voltage application schemes.

Figure 12:
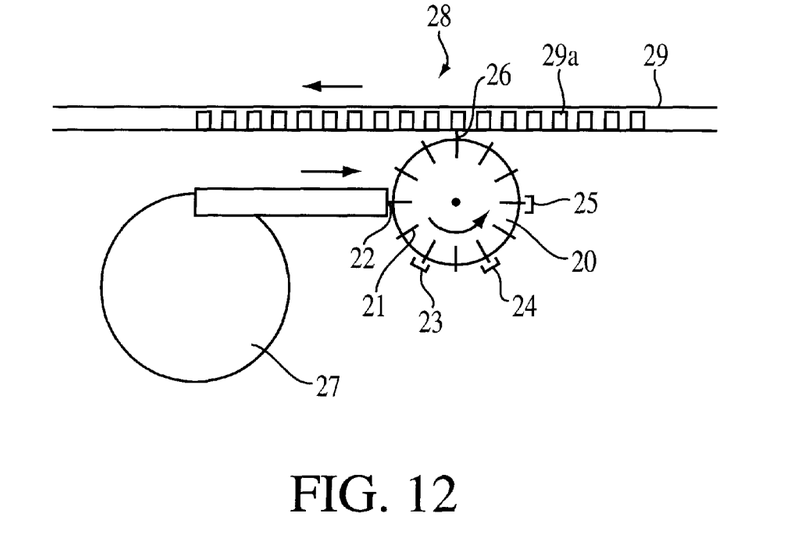
FIG. 12 is a plan view of one example of a characteristic measurement/screening/taping device which employs a method of the invention.

FIG. 12 shows one exemplary characteristic-measurement/screening/taping apparatus employing the method of the invention.

In this drawing, numeral 20 is used to designate a turn table, which is intermittently rotatable at constant intervals or pitches along a direction as indicated by an arrow. The turn table 20 has a plurality of support members 21 mounted along its peripheral edge at equal-pitch distances between them, wherein each member acts to support thereon a single chip capacitor as an object to be measured. Provided around turn table 20 are a supply section 22 for feeding capacitor chips to table 20, a capacitance measurement section 23, a chargeup IR measurement section 24 embodying the principles of the invention, a defective product outlet section 25, an acceptable product attachment section 26, and other elements not shown. The supply section 22 is coupled to a supply device 27 which operates to supply capacitor chips to turn table 20 on a one-by-one basis. The supply device 27 may be a parts feeder.

Also, a taping device 28 is disposed correspondingly to the acceptable product attachment section 26. Taping device 28 operates to drive a base tape 29 for use in storing therein capacitor chips in such a way such that tape 29 intermittently progresses or travels at every single pitch in the direction as designated by an arrow to thereby ensure that a single acceptable capacitor is stored at a time into a corresponding one of storage sections 29a of base tape 29 from the acceptable product attachment section 26. After storage of one capacitor into storage section 29a, taping device 28 applies a cover tape (not shown) by adhesion onto base tape 29 in a known way.

In the case of the prior art, it has been strictly required that each capacitor be charged up on the turn table for a long time period, which would make it impossible to achieve precise synchronization with the taping device. To avoid this, the prior art apparatus must be arranged such that a predetermined number of acceptable capacitors which passed the screening test and which have already been subjected to characteristic measurement on the turn table are stored or "stocked" in an attachment container or the like, and that such capacitors are again taken one by one out of the attachment container by use of an appropriate parts feeder or the like, for delivery to the taping device. This complicated arrangement disadvantageously serves to greatly reduce the speed of the work procedure extending from the characteristic measurement to the final packing while undesirably increasing facility scale and manufacturing costs.

In contrast, use of the disclosed methods of the invention make it possible to rapidly obtain a capacitor's current during charging, i.e. the insulation resistance. This may enable any intended insulation resistance measurement to be completed during one or several interruption periods of the turn table 20 while simultaneously allowing the chargeup IR measurement section 24 to be constituted by a decreased number of blocks. Accordingly, it becomes possible to let turn table 20 be accurately synchronized with taping device 28 during operation, which may in turn lead to the ability to directly feed respective characteristic-measured capacitors from turn table 20 to taping device 28. This results in an increase in work speed as compared to the prior art while reducing facility complexity and size as well as production costs.

Figure 13:
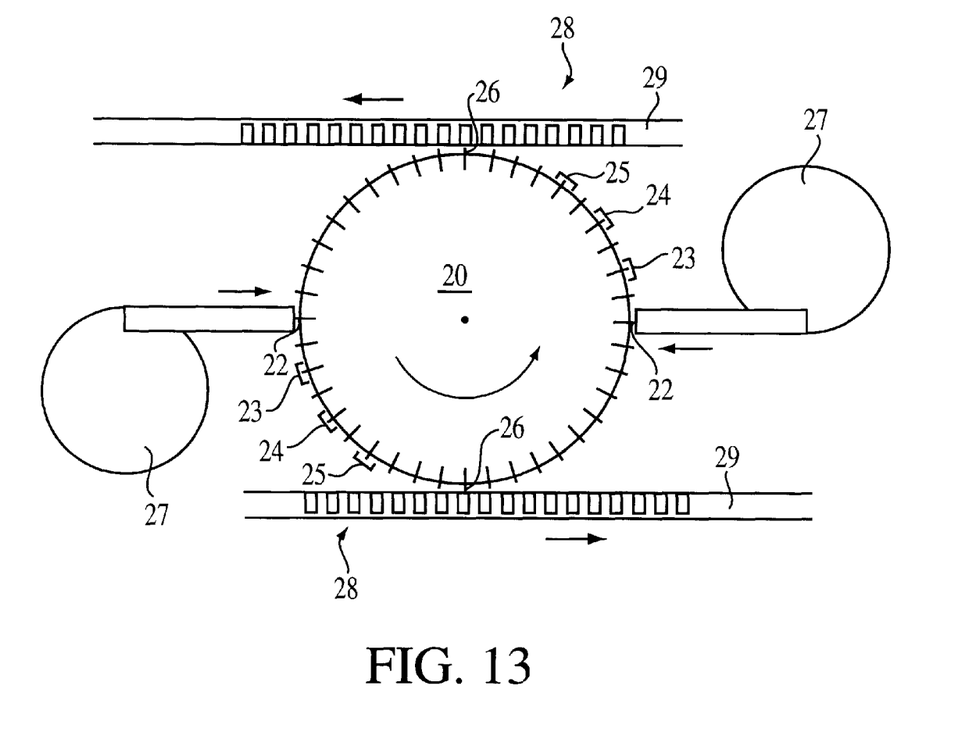
FIG. 13 is a plan view of another example of a characteristic measurement/screening/taping device employing a method of the invention.

FIG. 13 shows another exemplary characteristic-measurement/screening/taping apparatus employing the method of the invention.

This apparatus includes a single turn table 20, a pair of supply devices 27 disposed on opposite sides of table 20, and two taping devices 28 with table 20 being centrally placed therebetween. Two tapes 29 are arranged to travel in opposite directions to each other.

In the case of this apparatus, a further improvement of work speed and efficiency may be attainable when compared to the apparatus of FIG. 12.

Figure 14:
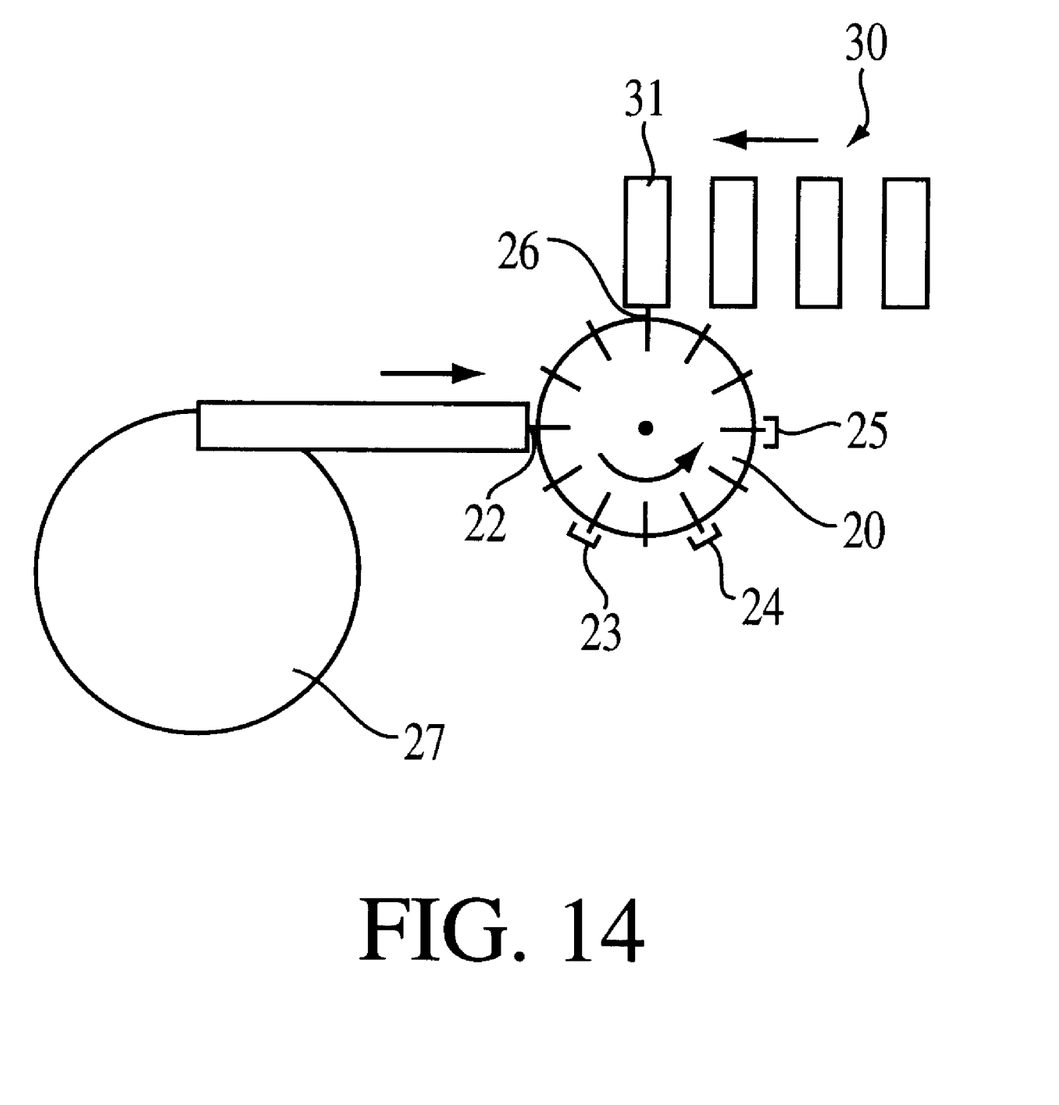
FIG. 14 is a plan view of one example of a characteristic measurement/screening/bulk-case packing device which employs a method of the invention.

FIG. 14 illustrates one exemplary characteristic-measurement/screening/bulk-packing apparatus.

In this apparatus, acceptable capacitors which have been taken out via parts feeder 27 and turn table 20 are packed by a bulk packing device 30 from table 20 into a bulk casing 31. Bulk casing 31 is configured to be capable of storing therein a predefined number of capacitors thus enabling bulk casing 31 to be driven toward the direction of an arrow after completion of storage of a packet of such predefined number of capacitors.

In this case also, similar advantages to those of the FIG. 12 embodiment may be attainable.

In case that the current calculation equation is modified, linear approximation is preferably carried out in order to evaluate the coincidence degree. In this case, using log m(t)–log i(t), log m(t)/log i(t), m(t)/i(t), or m(t)–i(t) as the evaluation function n(t), linear approximation can be performed with the evaluation function n(t) and time being plotted along coordinate axes. When y=ax+b is used as the linear approximation equation, and when n(t)=log m(t)–log i(t) or n(t)=m(t)–i(t), the coincidence is completed when a is close to 0 and b is close to 0. On the other hand, when n(t)–log m(t)/log i(t) or n(t)–m(t)/i(t), the coincidence is completed when a is close to 0 and b is close to 1.

Further, quadratic curve approximation can be used for evaluating the coincidence degree. The quadratic curve approximation can be used together with the linear approximation. Namely, in linear approximation, completion of coincidence may be judged when gradient a and intercept b are both near zero in value, as described above. However, the measured value and the approximation line are not actually identical to each other. If this is the case, the use in addition of quadratic curve approximation may enable the coincidence degree to be evaluated with enhanced accuracy.

Note that any arbitrary logarithm, in addition to the common logarithm or the natural logarithm, can be used as the logarithm in the present invention.

While the illustrative embodiments are arranged to predict the current value during charging by use of the current calculation equation based on the equivalent circuit of a capacitor to be measured, the current value prediction during charging may alternatively be done using other schemes such as approximation equations.

Further, in the embodiments, the capacitances $C_1, C_2 \ldots C_n$ which are the dielectric polarization component of the equivalent circuit and the resistances $R_1, R_2 \ldots R_n$ are set in the relation of a geometric progression; however, these may alternatively be set in relations other than such geometric progression as long as the method renders the capacitances $C_1$–$C_n$ and resistances $R_1$–$R_n$ determinable by the coincidence degree of an actually measured current value m(t) and a calculated current value i(t).

Furthermore, while in the illustrative embodiments the linear or quadratic-curve approximation regime is employed in order to evaluate the coincidence degree between the actually measured current value m(t) and calculated current value i(t), other prior known approximation schemes may also be employed therefor.

It should be noted that the invention should not exclusively be limited to ceramic capacitors, and may also be applicable to any other types of capacitors as far as these have dielectric polarization components, such as electrolytic capacitors, film capacitors and the like.

As apparent from the foregoing explanation, according to this invention, since the current value during the charging operation is predicted by using the current value in the chargeup region of the dielectric polarization component of a capacitor upon application of a voltage thereto, it becomes possible to predict a final current value (a current value after elapse of one minute, by way of example) within a shortened time period and with accuracy thus enabling achievement of efficient measurement of the insulation resistance of the capacitor.

In addition, prediction of such final charging current value can be further enhanced in accuracy where a method is employed which includes the steps of obtaining a current calculation equation from the equivalent circuit of a capacitor, modifying the current calculation equation by comparing an actually measured capacitor current value in a chargeup region of the dielectric polarization component at an initial period of voltage application to the calculated current value, and then predicting a current value at a chargeup termination time point based on this modified current calculation equation.

While the invention has been particularly shown and described with reference to embodiments thereof, it will be understood by those skilled in the art that the foregoing and other changes in form and details may be made therein without departing from the spirit and scope of the invention.

What is claimed is:

1. A method of measuring a charging current of a capacitor comprising the steps of:

applying a direct current voltage to the capacitor; and predicting a current value during charging by use of a current value measured in a charge region of a dielectric polarization component of the capacitor upon application of a voltage thereto.

2. A method of measuring a charging current of a capacitor according to claim 1, wherein the step of predicting a current value during charging includes the steps of:

initially determining a current calculation equation using an equivalent circuit of the capacitor;

modifying the current calculation equation by determining capacitances $C_1, C_2 \ldots C_n$ which are dielectric polarization components of the equivalent circuit and corresponding resistances $R_1, R_2 \ldots R_n$ in such a way that an actually measured capacitor current value m(t) is identical to a calculated current value i(t) as obtained using said current calculation equation; and determining said current value during charging by using said modified current calculation equation.

3. A method of measuring a charging current of a capacitor according to claim 2, wherein the capacitances $C_1, C_2 \ldots C_n$ and the resistances $R_1, R_2 \ldots R_n$ are determined by obtaining respective initial terms $C_1, R_1$ and common ratios p, q while setting the capacitances $C_1, C_2 \ldots C_n$ and the resistances $R_1, R_2 \ldots R_n$ in a geometric sequence of numbers.

4. A method of measuring a charging current of a capacitor according to claim 2 or 3, said step of modifying the current calculation equation further comprising the step of carrying out linear approximation with log m(t)–log i(t) and time being plotted along coordinate axes, in order to evaluate the degree of coincidence between the actually measured current value m(t) and calculated current value i(t) of the capacitor.

5. A method of measuring a charging current of a capacitor according to claims 2 or 3, said step of modifying the current calculation equation further comprising the step of carrying out quadratic curve approximation with log m(t)–log i(t) and time being plotted along coordinate axes, in order to evaluate the degree of coincidence between the actually measured current value m(t) and calculated current value i(t) of the capacitor.

6. A method of measuring a charging current of a capacitor according to claim 2 or 3, said step of modifying the current calculation equation further comprising the step of carrying out linear approximation with log m(t)/log i(t) and time being plotted along coordinate axes, in order to evaluate the degree of coincidence between the actually measured current value m(t) and calculated current value i(t) of the capacitor.

7. A method of measuring a charging current of a capacitor according to claim 2 or 3, said step of modifying the current calculation equation further comprising the step of carrying out quadratic curve approximation with log m(t)/log i(t) and time being plotted along coordinate axes, in order to evaluate the degree of coincidence between the actually measured current value m(t) and calculated current value i(t) of the capacitor.

8. A method of measuring a charging current of a capacitor according to claim 2 or 3, said step of modifying the current calculation equation further comprising the step of carrying out linear approximation with m(t)/i(t) and time being plotted along coordinate axes, in order to evaluate the degree of coincidence between the actually measured current value m(t) and calculated current value i(t) of the capacitor.

9. A method of measuring a charging current of a capacitor according to claims 2 or 3, said step of modifying the current calculation equation further comprising the step of carrying out quadratic curve approximation with m(t)/i(t) and time being plotted along coordinate axes, in order to evaluate the degree of coincidence between the actually measured current value m(t) and calculated current value i(t) of the capacitor.

10. A method of measuring a charging current of a capacitor according to any one of claims 1–3, comprising the step of applying a charging current to the capacitor greater than 50 mA.

11. A method of measuring a charging current of a capacitor according to claim 4, said step of modifying the current calculation equation further comprising the step of carrying out quadratic curve approximation with log m(t)−log i(t) and time being plotted along coordinate axes, in order to evaluate the degree of coincidence between the actually measured current value m(t) and calculated current value i(t) of the capacitor.

12. A method of measuring a charging current of a capacitor according to claim 6, said step of modifying the current calculation equation further comprising the step of carrying out quadratic curve approximation with log m(t)/log i(t) and time being plotted along coordinate axes, in order to evaluate the degree of coincidence between the actually measured current value m(t) and calculated current value i(t) of the capacitor.

13. A method of measuring a charging current of a capacitor according to claim 8, said step of modifying the current calculation equation further comprising the step of carrying out quadratic curve approximation with m(t)/i(t) and time being plotted along coordinate axes, in order to evaluate the degree of coincidence between the actually measured current value m(t) and calculated current value i(t) of the capacitor.

14. A method of measuring a charging current of a capacitor according to claim 4, comprising the step of applying a charging current to the capacitor greater than 50 mA.

15. A method of measuring a charging current of a capacitor according to claim 5, comprising the step of applying a charging current to the capacitor greater than 50 mA.

16. A method of measuring a charging current of a capacitor according to claim 2 or 3, said step of modifying the current calculation equation further comprising the step of carrying out linear approximation with m(t)−i(t) and time being plotted along coordinate axes, in order to evaluate the degree of coincidence between the actually measured current value m(t) and calculated current value i(t) of the capacitor.

17. A method of measuring a charging current of a capacitor according to claim 2 or 3, said step of modifying the current calculation equation further comprising the step of carrying out quadratic approximation with m(t)−i(t) and time being plotted along coordinate axes, in order to evaluate the degree of coincidence between the actually measured current value m(t) and calculated current value i(t) of the capacitor.

18. A method of measuring a charging current of a capacitor according to claim 6, comprising the step of applying a charging current to the capacitor greater than 50 mA.

19. A method of measuring a charging current of a capacitor according to claim 7, comprising the step of applying a charging current to the capacitor greater than 50 mA.

20. A method of measuring a charging current of a capacitor according to claim 8, comprising the step of applying a charging current to the capacitor greater than 50 mA.

21. A method of measuring a charging current of a capacitor according to claim 9, comprising the step of applying a charging current to the capacitor greater than 50 mA.

22. A method of measuring a charging current of a capacitor according to claim 16, comprising the step of applying a charging current to the capacitor greater than 50 mA.

23. A method of measuring a charging current of a capacitor according to claim 17, comprising the step of applying a charging current to the capacitor greater than 50 mA.

24. A method of measuring a charging current of a capacitor according to claim 16, said step of modifying the current calculation equation further comprising the step of carrying out quadratic curve approximation with m(t)−i(t) and time being plotted along coordinate axes, in order to evaluate the degree of coincidence between the actually measured current value m(t) and the calculated current value i(t) of the capacitor.

25. An apparatus for measuring a charging current of a capacitor comprising:
a charging device which applies a DC voltage to charge a capacitor; and
a predicting device which is operable to predict a current value during charging of the capacitor by use of a charging current value measured in a charging region of a dielectric polarization component of the capacitor upon application of said DC voltage thereto.

26. A measuring apparatus according to claim 25, wherein said predicting device measures said charging current value by the steps of:
applying a direct current voltage to the capacitor; and
predicting a current value during charging by use of a current value measured in a charge region of a dielectric polarization component of the capacitor upon application of a voltage thereto.

27. A measuring apparatus according to claim 26, wherein the step of predicting a current value during charging includes the steps of:
initially determining a current calculation equation using an equivalent circuit of the capacitor;

modifying the current calculation equation by determining capacitances $C_1, C_2 \ldots C_n$ which are dielectric polarization components of the equivalent circuit and corresponding resistances $R_1, R_2 \ldots R_n$ in such a way that an actually measured capacitor current value m(t) is identical to a calculated current value i(t) as obtained using said current calculation equation; and determining said current value during charging by using said modified current calculation equation.

28. A measuring apparatus according to claim 27, wherein the capacitances $C_1, C_2 \ldots C_n$ and the resistances $R_1, R_2 \ldots R_n$ are determined by obtaining respective initial terms $C_1$, $R_1$ and common ratios p, q while setting the capacitances $C_1$, $C_2 \ldots C_n$ and the resistances $R_1, R_2 \ldots R_n$ in a geometric sequence of numbers.

29. A measuring apparatus according to claim 27 or 28, said step of modifying the current calculation equation further comprising the step of carrying out linear approximation with log m(t)–log i(t) and time being plotted along coordinate axes, in order to evaluate the degree of coincidence between the actually measured current value m(t) and calculated current value i(t) of the capacitor.

30. A measuring apparatus according to claim 29, said step of modifying the current calculation equation further comprising the step of carrying out quadratic curve approximation with log m(t)–log i(t) and time being plotted along coordinate axes, in order to evaluate the degree of coincidence between the actually measured current value m(t) and calculated current value i(t) of the capacitor.

31. A measuring apparatus according to claim 29, comprising the step of applying a charging current to the capacitor greater than 50 mA.

32. A measuring apparatus according to claims 27 or 28, said step of modifying the current calculation equation further comprising the step of carrying out quadratic curve approximation with log m(t)–log i(t) and time being plotted along coordinate axes, in order to evaluate the degree of coincidence between the actually measured current value m(t) and calculated current value i(t) of the capacitor.

33. A measuring apparatus according to claim 32, comprising the step of applying a charging current to the capacitor greater than 50 mA.

34. A measuring apparatus according to claim 27 or 28, said step of modifying the current calculation equation further comprising the step of carrying out linear approximation with log m(t)/log i(t) and time being plotted along coordinate axes, in order to evaluate the degree of coincidence between the actually measured current value m(t) and calculated current value i(t) of the capacitor.

35. A measuring apparatus according to claim 34, said step of modifying the current calculation equation further comprising the step of carrying out quadratic curve approximation with log m(t)/log i(t) and time being plotted along coordinate axes, in order to evaluate the degree of coincidence between the actually measured current value m(t) and calculated current value i(t) of the capacitor.

36. A measuring apparatus according to claim 34, comprising the step of applying a charging current to the capacitor greater than 50 mA.

37. A measuring apparatus according to claim 27 or 28, said step of modifying the current calculation equation further comprising the step of carrying out quadratic curve approximation with log m(t)/log i(t) and time being plotted along coordinate axes, in order to evaluate the degree of coincidence between the actually measured current value m(t) and calculated current value i(t) of the capacitor.

38. A measuring apparatus according to claim 37, comprising the step of applying a charging current to the capacitor greater than 50 mA.

39. A measuring apparatus according to claim 27 or 28, said step of modifying the current calculation equation further comprising the step of carrying out linear approximation with m(t)/i(t) and time being plotted along coordinate axes, in order to evaluate the degree of coincidence between the actually measured current value m(t) and calculated current value i(t) of the capacitor.

40. A measuring apparatus according to claim 39, said step of modifying the current calculation equation further comprising the step of carrying out quadratic curve approximation with m(t)/i(t) and time being plotted along coordinate axes, in order to evaluate the degree of coincidence between the actually measured current value m(t) and calculated current value i(t) of the capacitor.

41. A measuring apparatus according to claim 39, comprising the step of applying a charging current to the capacitor greater than 50 mA.

42. A measuring apparatus according to claims 27 or 28, said step of modifying the current calculation equation further comprising the step of carrying out quadratic curve approximation with m(t)/i(t) and time being plotted along coordinate axes, in order to evaluate the degree of coincidence between the actually measured current value m(t) and calculated current value i(t) of the capacitor.

43. A measuring apparatus according to claim 42, comprising the step of applying a charging current to the capacitor greater than 50 mA.

44. A measuring apparatus according to claim 27 or 28, said step of modifying the current calculation equation further comprising the step of carrying out linear approximation with m(t)–i(t) and time being plotted along coordinate axes, in order to evaluate the degree of coincidence between the actually measured current value m(t) and calculated current value i(t) of the capacitor.

45. A measuring apparatus according to claim 44, said step of modifying the current calculation equation further comprising the step of carrying out quadratic curve approximation with m(t)–i(t) and time being plotted along coordinate axes, in order to evaluate the degree of coincidence between the actually measured current value m(t) and the calculated current value i(t) of the capacitor.

46. A measuring apparatus according to claim 44, comprising the step of applying a charging current to the capacitor greater than 50 mA.

47. A measuring apparatus according to claim 27 or 28, said step of modifying the current calculation equation further comprising the step of carrying out quadratic approximation with m(t)–i(t) and time being plotted along coordinate axes, in order to evaluate the degree of coincidence between the actually measured current value m(t) and calculated current value i(t) of the capacitor.

48. A measuring apparatus according to claim 47, comprising the step of applying a charging current to the capacitor greater than 50 mA.

49. A measuring apparatus according to any one of claim 26, 27 or 28, comprising the step of applying a charging current to the capacitor greater than 50 mA.

* * * * *